United States Patent [19]

Stekly et al.

[11] Patent Number: 4,490,439
[45] Date of Patent: Dec. 25, 1984

[54] SUPERCONDUCTOR WITH IMPROVED PERSISTENCE CHARACTERISTICS

[75] Inventors: Zdenek J. J. Stekly, Wayland; Bruce P. Strauss, Brookline, both of Mass.

[73] Assignee: Magnetic Corporation of America, Waltham, Mass.

[21] Appl. No.: 592,202

[22] Filed: Mar. 22, 1984

[51] Int. Cl.³ ............................................. H01B 5/08
[52] U.S. Cl. .................................. 428/614; 428/610; 428/930; 29/599
[58] Field of Search .................. 428/614, 930; 29/599

[56] References Cited

U.S. PATENT DOCUMENTS 3,625,662  12/1971  Roberts et al. .................. 29/599
4,109,374   8/1978  Whetstone et al. ............... 29/599

*Primary Examiner*—Veronica O'Keefe
*Attorney, Agent, or Firm*—Audley A. Ciamporcero, Jr.

[57] ABSTRACT

In a multifilamentary superconductor, plural filaments are separated from one another by a ductile nonsuperconducting copper matrix. The niobium titanium filaments are arrayed through the copper, with one filament being substantially larger than the others, and preferably, centrally located in the wire. Preferably also, the other filaments are arrayed in an annular configuration about the periphery of the wire.

4 Claims, 4 Drawing Figures

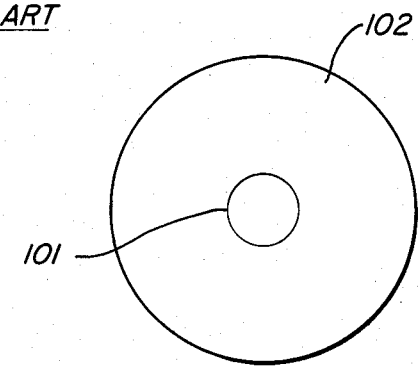
FIG-1A PRIOR ART
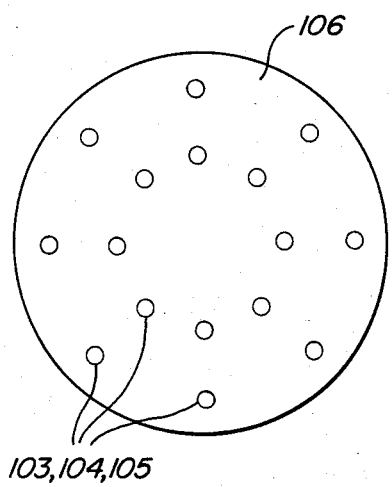
FIG-1B PRIOR ART
FIG-2
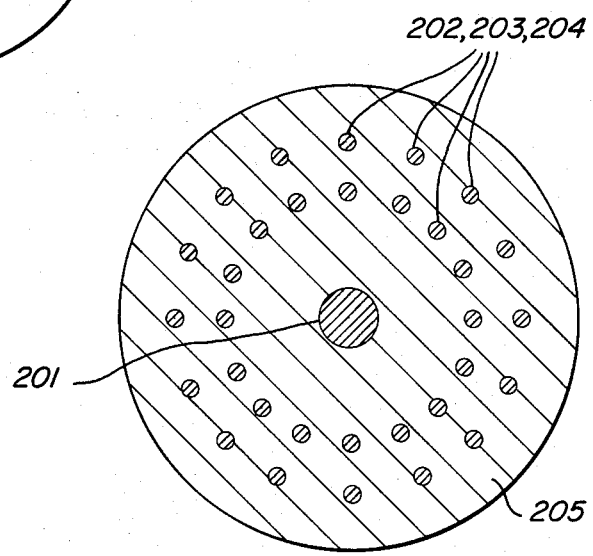

SUPERCONDUCTOR WITH IMPROVED PERSISTENCE CHARACTERISTICS

FIELD OF THE INVENTION

This invention relates to superconductive wire, and more particularly to configurations for such wire which bring about improved persistence characteristics.

BACKGROUND OF THE INVENTION

With the advent of new, potentially large sales volume applications of superconductive magnets, there is renewed interest in the physics and the economics of the manufacture of superconductive wire and superconductive coils. For example, it is anticipated that a substantial portion of the high field strength nuclear magnetic resonance imaging systems will employ superconductive magnets. Perhaps, hundreds of these magnets will be manufactured per year, transported to hospital and clinical sites, and undergo virtually continual hour-to-hour and day-to-day use thereafter. It is most desirable, then, that these magnets, which are essentially consumer commodities, should be of the utmost stability and should involve persistence characteristics of the highest order. In particular, it is important to consider that each time a superconductive magnet quenches (i.e. vaporizes and exhausts cryogenic liquids due to the heat generated as the magnet becomes resistive), the entire imaging system must go offline to re-establish uniform cryogenic conditions and to re-establish a persistent superconducting state. This situation is an inconvenience in any event, but will be all the more critical if a multimillion dollar clinical imaging system is forced offline during the process.

It is, therefore, a general object of the present invention to provide superconductive wire designs and configurations which substantially improve the persistence characteristics thereof.

Superconductive wire joints provide one common source of resistivity in superconductive coils. For small coils, consisting of a superconductive filament and copper cladding, wire-to-wire joints are easily made and good persistence is achieved. As the coils become larger, for example those such as are utilized in nuclear magnetic resonance imaging systems, it is desirable to utilize superconducting wire with many superconducting filaments. See, for example, the wire designs set forth in U.S. Pat. No. 3,625,662 to Roberts et al., entitled "SUPERCONDUCTOR". That patent teaches, for example, the use of multiple superconducting filaments embedded in a matrix of nonsuperconducting metal, such as copper. Establishing wire-to-wire joints for such multifilamentary wire is, however, a formidable task. Even the most careful and exacting procedures for establishing a joint result in some amount of poor registry and/or poor electrical coupling between associated elements across the joint. In the end, there is effectively established a resistance matrix between each superconducting filament on one side of the joint, and each of the others on the other side of the joint. This establishes a semi-unique current distribution across each joint, depending upon the structure giving rise to the joint. General objects in the art of multifilamentary wire joints, therefore, are to make all these interconductor resistances quite small. In fact, however, the prior art is understood to provide little in the way of insuring, a priori, that a complete, very low resistance joint will be established. In other words, conventional wisdom has been that one must be content to live with some small amount of resistive transfer at the joint, together with the concomitant uncertainty as to how significant that resistance will be.

It is an object of the present invention to provide multifilament superconducting wire designs and configurations which eliminate or at least minimize with certainty the degree of resistive energy transfer which will occur at wire joints. It is a related but by no means insignificant object that such designs be relatively compatible with prevailing joint making techniques, and that the resulting wire involve material selection and cost constraints which are comparable to those of conventional multifilamentary wire.

SUMMARY OF THE INVENTION

The principles of the present invention are premised on utilization of a given one (or more) superconductive filament which is substantially larger than the others, and which in fact is sufficiently large in cross-section to insure good registry, and essentially a resistance-free joint. In fact, such registry is insured as to permit the use of resistance arc welding techniques to create joints.

In preferred configuration, this larger superconductive filament is located on the central axis of the wire, and the other filaments are disposed in an annular configuration thereabout, located near the outer surface of the wire and separated from the central portion by a ductile nonsuperconductive material such as copper. Therefore, in the normal course and at joints wherein high persistence, low resistance jointure is achieved among the small outer filaments, current will flow in the outer surface regions of the wire. In the event that a poor joint is achieved among the small outer filaments, however, the large central filament will provide a resistance-free pathway (zero electrical field gradient) across the joint. On the other side of the joint, current will redistribute in conventional fashion and proceed along the wire. At the joint, then, the only resistance met by the current is that associated with the redistribution of current between the outer surface and the central, larger filament, and this resistance is both small and certain in amount. The designer may therefore accurately and reliably take this into account in his design, and obviate the untoward effects common to the known prior art.

BRIEF DESCRIPTION OF THE DRAWINGS

FIGS. 1A and 1B sow respective single filament and multifilament superconductive wire configurations in accordance with the prior art.

FIG. 2 shows in cross section an illustrative version of a high persistence multifilament in accordance with the principles of the present invention.

BEST MODE OF CARRYING OUT THE INVENTION

Figure 3:
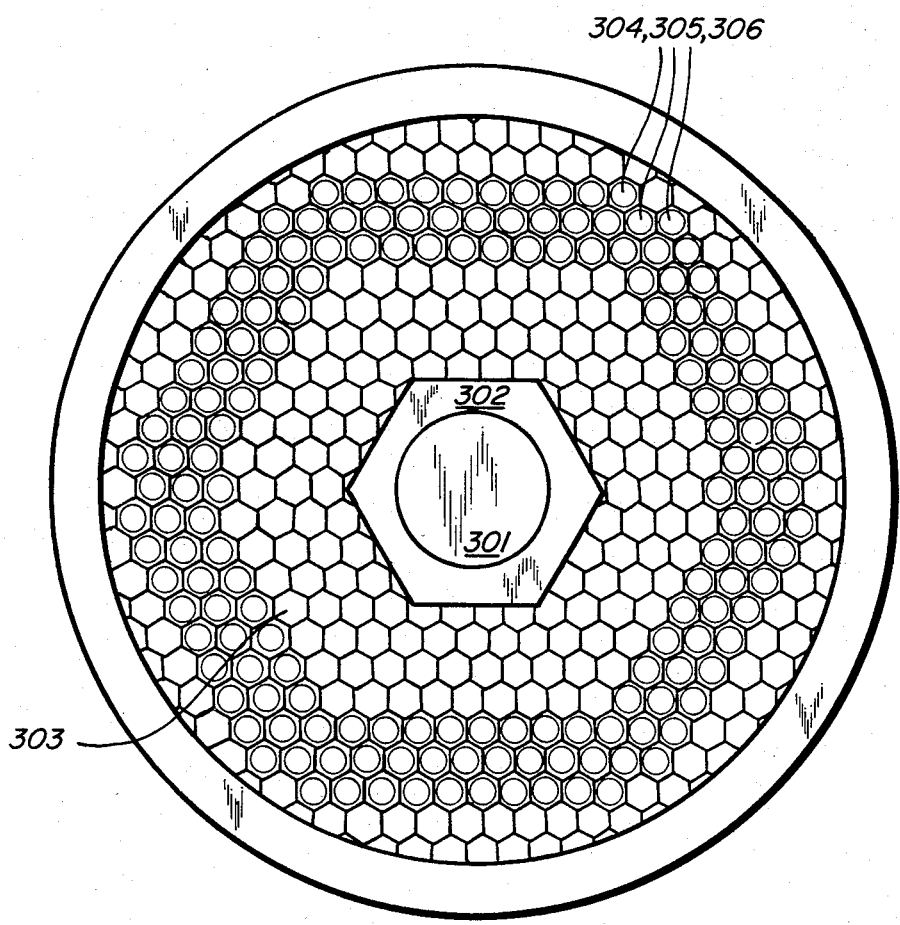
FIG. 3 shows a billet arrayed in accordance with the principles of the present invention, suitable for drawing and rolling procedures to convert it to superconducting wire.

Referring first to FIGS. 1A and 1B, there is shown a couple of state of the art versions of superconducting wire known to the inventors hereof. In particular, FIG. 1A shows a single filament wire wherein a superconductor 101 is located on a central axis, and is surrounded by a resistive metal cladding 102, such as copper. In FIG. 1B, a resistive matrix 106, also for example copper, has imbedded therein a matrix of superconductive filaments 103, 104, 105, etc. Niobium titanium alloy is a conventional composition for the superconductive filaments of FIGS. 1A and 1B.

As is known in the art, and set forth for example in the previously cited Roberts et al. patent, superconductive wire in accordance with prior art designs, as well as designs in accordance with the principles of the present invention, are produced by forming a composite billet, having the general cross-section configuration desired, which is then reduced in diameter by suitable means to provide a wire configuration. Often, for example, the billet is constricted by successive iterations or combinations of extrusions, hot or cold rolling, hot or cold drawing, and the like. These procedures are believed sufficiently well-known and documented in the art, and applicable to the principles of the present invention without variation, that no further disclosure will be provided herein.

In the prior art, and especially with respect to multifilamentary superconductors as set forth in FIG. 1B, a conventional mode of joining wire strands is to bare the superconductive filament at the joint, abut them as closely as possible, and immerse the entire joint in superconductive material. Such an approach is acceptable for use in accordance with the principles of the present invention, but a more preferable mode of joining is to utilize resistance welding of the opposite wires as they are held in abutment with one another. It will be appreciated that the location of a substantially larger filament in the central portion of the wire in accordance with the principles of the present invention provides ample registry and basis for use of resistance welding.

Referring next to FIG. 2, there is shown a high persistence multifilamentary superconductor configuration in accordance with the principles of the present invention. In FIG. 2, a ductile resistive metal such as copper forms a matrix 205 in which the superconductive filaments are held in predetermined cross-sectional relationship. In accordance with the principles of the present invention, a central, larger superconductive filament 201 is located on the axis of the wire (and the billet, and the product of stes intermediate therebetween). Smaller superconductive filaments such as 202, 203, 204, etc. are held in the copper matrix in the form of an annulus surrounding the larger central filament. It will be appreciated even from visual consideration of the embodimemt of FIG. 2 that any reasonable abutment of associated wire ends to be joined will involve a very high probability that the larger central filaments 201 will be in suitable registry with one another. Therefore, whether superconductor immersion or resistance weldment is contemplated, the principles of the present invention provide high assurance that, at the least, a good (i.e. substantially zero resistance) joint will be formed at the larger central filament.

Therefore, when a coil composed of wire in accordance with the principles of the present invention is charged up, the current flows in conventional fashion in the outer filaments. Should there be any resistance in the joints of the outer filaments, there would be the tendency known in the prior art for the current to experience resistive decay. However, the continuous circuit formed by the larger central filament 201 has substantially no resistance, and a result current will show a preference to cross the joint through the central filament, as opposed to experiencing decay in the higher resistance poor joint of the outer filaments. The net result is that wire configurations in accordance with the principles of the present invention result in a redistribution of current without substantial decay of the total coil current, or substantial decay in the magnetic field produced by the coil. Correspondingly, there is avoided substantially totally the possibility of such high joint resistance as would render the coil inoperative or inefficient.

Referring next to FIG. 3, there is shown an end view of a billet for preparation of superconducting wire in accordance with the principles of the present invention. In FIG. 3, the well-known use of nested hexagonal rods is employed. In the center of the billet, a large superconducting rod, preferably niobium titanium alloy, 301 is carried within a hexagonal copper jacket 302. Smaller hexagonal copper rods form an annulus 303 about the inner hexagonal rod 301 and 302, and radially outwardly beyond the copper annulus 303 is another superconducting annulus. In particular, the outer, superconducting annulus is made up of smaller superconducting rods such as 304, 305, and 306, each in turn being jacketed by a hexagonally configured copper cladding. Thus, the billet of FIG. 3 in accordance with the principles of the present invention mimics the eventual shape of the wire, with a central superconducting element which is substantially larger than the others, and with an array of smaller filaments annularly disposed therearound, located variously radially outward therefrom, near what would be the outer surface of the wire. It will be appreciated that once the billet is fully processed into wire, through rolling, extrusions, and so on, the hexagonal elements are all fused one to the other, yielding a continuous wire cross-section.

It will be noted that advantageous joints are achieved in accordance with the principles of the present invention through a pair of factors. First, the larger size of the given filament insures registry thereof irrespective of the location of the larger filament in the wire cross-section. That is, it is not essential that the larger filament be so centrally located, although this is the best mode contemplated at the time of filing. Secondly, location as in preferred embodiments in the center insures registry, and perhaps will effect and reduce the ultimate specification of size of the central, larger filament. In particular, to the extent that axial location of the largr filament permits objective certainty of registry at the time of weldment, and permits sufficient current to carry out the weldment procedure, that is perhaps a permissible reduction in the size of the larger filament. Clearly, in view of the cost and scarcity of superconducting alloy, the size of the larger filament in accordance with the principles of the present invention should be kept at a relative minimum, so long as it is adequate to achieve the goals of good joints, and susceptibility to resistance weldment joining techniques. In preferred embodiments, the location and relative sizes of the filaments are on the order shown in the billet of FIG. 3.

It will be appreciated that numerous alternative embodiments will occur to those of ordinary skill in the art without departure from the spirit or the scope of the present invention. For example, while preferred embodiments utilize copper as the resistive matrix material, it will be understood that copper is selected for its combination of ductility and good resistive current carrying capacity. Clearly, other analagous materials could be used as well. Likewise, selection of niobium titanium alloy as the superconducting filament material is in accordance with prevailing wisdom, but other formulations no doubt will be developed which possess the requisite ductility and superconductive characteristics as to make them amenable to superconductive wire in accordance with the principles of the present invention. Finally, as suggested hereinbefore, the ultimate selection of sizes and locations of the larger filament will be governed by the choice and predelection of the designer, giving due consideration to the cost and availability of superconductive materials, general quality of joints achievable in the outer, smaller filaments, effectiveness of resistance weldment techniques, and relative levels of assurance that spatial registry is achieved giving rise to better joints in accordance with the principles of the present invention.

We claim:

1. A composite superconductive material structure comprising:
    (a) a non-superconductive metal matrix; and
    (b) plural superconductive filaments spaced apart in predetermined longitudinal cross section within said matrix; characterized in that
    (c) a given one of said superconductive filaments being substantially larger in longitudinal cross section than are the others of said superconductive filaments, whereby substantially non-resistive connection maybe insured at joints of said composite material through registry across the joints at said substantially larger filaments.

2. Structure as defined in claim 1 wherein said larger filament is substantially centrally located in said predetermined cross section, and wherein said other filaments are arrayed in an annular configuration surrounding said larger filament.

3. Structure as defined in claim 2 wherein said matrix is copper.

4. Structure as defined in claim 2 wherein said superconductive filaments are a niobium-titanium alloy.

* * * * *